United States Patent
Jones et al.

(10) Patent No.: US 6,233,271 B1
(45) Date of Patent: *May 15, 2001

(54) METHOD AND APPARATUS FOR DECODING TRELLIS CODED DIRECT SEQUENCE SPREAD SPECTRUM COMMUNICATION SIGNALS

(75) Inventors: William W. Jones; Thomas J. Kenney, both of San Diego, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/002,262

(22) Filed: Dec. 31, 1997

(51) Int. Cl.$^7$ ............................... H04L 27/32; H04L 1/00
(52) U.S. Cl. ........................ 375/142; 375/150; 375/341; 718/795; 718/796
(58) Field of Search .................................. 375/200, 206, 375/208, 210, 265, 341; 714/792, 794, 796

(56) References Cited

U.S. PATENT DOCUMENTS

| | | | | |
|---|---|---|---|---|
| 5,416,797 | * | 5/1995 | Gilhousen et al. | 375/705 |
| 5,602,833 | * | 2/1997 | Zehavi | 370/209 |
| 5,757,844 | * | 5/1998 | Fukawa et al. | 375/200 |
| 5,767,738 | * | 6/1998 | Brown et al. | 329/304 |
| 5,844,947 | * | 12/1998 | Cesari | 375/341 |
| 5,862,190 | * | 1/1999 | Schaffner | 375/341 |
| 5,966,377 | * | 10/1999 | Murai | 370/342 |
| 6,038,695 | * | 3/2000 | Pehkonen | 714/786 |

OTHER PUBLICATIONS

Shu Lin, et al., *"Error Control Coding: Fundamentals and Applications"*, 1983, by Prentice–Hall, Inc., Englewood Cliffs, N.J., pages 1–603 (8 pages submitted).

Brian D. Woerner, et al.; Trellis–Coded Direct–Sequence Spread–Spectrum Communications; IEEE Trans. on Communications; Dec., 1994; vol. 42, No. 12; pp. 3161–3170.

Guillern Fernenias, et al.; Performance of Trellis–Coded DS–CDMA over Frequency–Selective Fading Mobile Radio Channels; 1996 IEEE 46th Vehicular Technology Conference; Atlanta Georgia, Apr. 28–May 1, 1996; pp. 402–406.

(List continued on next page.)

*Primary Examiner*—Amanda T. Le
(74) *Attorney, Agent, or Firm*—Blakely, Sokoloff, Taylor & Zafman LLP

(57) ABSTRACT

A method and an apparatus for decoding trellis coded direct sequence spread spectrum communication signals are provided. A transmitted QPSK signal is received. Binary phase-shift keyed (BPSK) despreading is performed on the QPSK signal. The BPSK despreading comprises correlating the in-phase and the quadrature components of the received QPSK signal with independent PN sequences for the each of the in-phase and the quadrature components. The despread signal is then demultiplexed, and the pilot signal and the BPSK data signal are recovered. The recovered pilot signal is used to provide a channel phase estimate and a channel magnitude estimate. The recovered BPSK data signal is demodulated, despread, and decoded. The despreading and decoding comprises determining a number of cross-correlation terms of the received signal using a number of transmitted biorthogonal Walsh sequences. The cross-correlation terms are used as the branch metrics in a maximum likelihood decoding algorithm. The branch metrics may be computed with a Fast Walsh Transform scaled in response to the channel phase estimate from the recovered pilot signal. The maximum likelihood decoding algorithm may be a Viterbi algorithm in which the optimum path is the path with the maximum accumulated branch metric. The decoding algorithm recovers and outputs a transmitted data bit sequence.

33 Claims, 18 Drawing Sheets

OTHER PUBLICATIONS

Peyton Z.Peebles, Jr.; Digital Communications Systems; 1987 Prentice–Hall, Inc. Publishers; pp. 6–114.

Peyton Z. Peebles, Jr.; Digital Communications Systems; 1987 Prentice–Hall, Inc. Publishers; pp. 251–356.

Leon W. Couch III; Digital and Analog Communication Systems; Fourth Edition; 1993 Macmillan Publishing Company; pp. 27–30.

Leon W. Couch III Digital and Analog Communication Systems, Fourth Edition; 1993 Macmillan Publishing Company; pp. 449–458.

Sanjit K. Mitra and James F. Kaiser; Handbook for Digital Signal Processing; 1993 John Wiley & Sons Publishers; pp. 559–561.

Vijay K. Garg, Kenneth Smolik and Joseph E. Wilkes; Applications of CDMA in Wireless/Personal Communications; 1997 Prentice–Hall PTR, Prentice–Hall, Inc.; pp. 9–138.

* cited by examiner

| CODED SYMBOLS | DECIMAL REPRESENTATION | WALSH SEQUENCE |
|---|---|---|
| 000 | 0 | V(0) |
| 001 | 1 | V(1) |
| 010 | 2 | V(2) |
| 011 | 3 | V(3) |
| 100 | 4 | -V(3) |
| 101 | 5 | -V(2) |
| 110 | 6 | -V(1) |
| 111 | 7 | -V(0) |

FIG. 12

| BRANCH LABEL | DECIMAL REPRESENTATION | BRANCH METRIC |
|---|---|---|
| 000 | 0 | $c(0)$ |
| 001 | 1 | $c(1)$ |
| 010 | 2 | $c(2)$ |
| 011 | 3 | $c(3)$ |
| 100 | 4 | $-c(3)$ |
| 101 | 5 | $-c(2)$ |
| 110 | 6 | $-c(1)$ |
| 111 | 7 | $-c(0)$ |

FIG. 17

METHOD AND APPARATUS FOR DECODING TRELLIS CODED DIRECT SEQUENCE SPREAD SPECTRUM COMMUNICATION SIGNALS

FIELD OF THE INVENTION

This invention relates to spread spectrum communications systems. More particularly, this invention relates to the encoding, modulation, demodulation, and decoding of communication signals in a spread spectrum communications system.

BACKGROUND OF THE INVENTION

A typical prior art communication system comprises a transmitting station and a receiving station, and a connecting medium called a channel. Two-way communication requires each station to have both a transmitter and a receiver. FIG. 1 is a functional block diagram of a prior art communication system. The transmitting subsystem 102 of this communication system 100 accepts either digital or analog signals as inputs. An analog-to-digital converter 104 is coupled to receive an analog input signal 106 and to periodically sample the analog input waveform. The digital signal 108, comprising discrete voltage levels, output from the analog-to-digital converter is coupled to be received by a source encoder 110. The general purpose of the source encoder 110 is to convert effectively each discrete symbol into a suitable digital representation, often binary.

In some systems where no channel encoding function 112 is present, the source encoder 110 output is converted directly to a suitable waveform within the modulation function for transmission over the channel. Noise and interference added to the waveform cause the receiver's demodulation operation to make errors in its effort to recover, or determine, the correct digital representation used in the transmitter. By including the channel encoding 112 function in the typical communication system, the effects of channel-caused errors can be reduced. The channel encoder 112 makes this reduction possible by adding controlled redundancy to the source encoder's 110 digital representation in a known manner such that errors may be reduced. The channel encoded signal is coupled to be received by the modulator 114. The modulator 114 converts the binary symbols of the source information into a suitable waveform for transmission over the channel 116 using a signal with a particular carrier frequency.

The functions performed in the receiving subsystem 118 typically reflect the inverse operations of those in the transmitting subsystem 102. The demodulator 120 recovers the best possible version of the output that was produced by the channel encoder 112 at the transmitter subsystem 102. The channel decoder 122 reconstructs, to the best extent possible, the output that was generated by the source encoder 110 at the transmitter subsystem 102. It is here that the controlled redundancy inserted by the channel encoder 112 may be used to identify and correct some channel-caused errors in the demodulator's 120 output. The source decoder 124 performs the exact inverse of the source encoding 110 function.

As previously discussed, the purpose of the channel encoder is to convert the source code to a form that will allow the receiver to reduce the number of errors that occur in its output due to channel noise. As such, the channel encoder adds redundancy to the source code by inserting extra code digits in a controlled manner so that the receiver can possibly detect and correct channel-caused errors. One class of encoding process uses a coding method and apparatus that produces convolutional codes.

Convolutional codes involve memory implemented in the form of binary shift registers having K cascaded registers, each with k stages. The sequence of source digits is shifted into and along the overall register, k bits at a time. Appropriate taps from the various register stages are connected to n modulo-2 adders. The output code becomes the sequence of n digits at the output of these adders generated once for every input shift of k source digits. The ratio k/n is called the code rate, and K is called the constraint length. Therefore, each n-bit output codeword depends on the most recent k source bits stored in the first k-stage shift register as well as K-1 earlier blocks of k source bits that are stored in the other registers.

Tree diagrams, trellis diagrams, and state diagrams may be used to describe a convolutional code. The number of branches in a tree diagram doubles each time a new input digit occurs. For a long sequence of input digits to be encoded, the usefulness of the tree diagram is limited. A better approach uses a trellis diagram because the trellis diagram, while carrying the same information as a tree diagram, makes use of the fact that the tree is periodic in the steady state condition and involves only a finite number of states. The typical convolutional encoder of rate k/n and constraint length K will have $2^k$ branches leaving each state node making the number of possible states $2^{k(K-1)}$.

In the receiver subsystem, the demodulator will estimate what sequence of binary digits is being received over the channel. The purpose of the channel decoder is to accept the erroneous sequence of demodulator output digits and produce the most accurate replica possible of the source sequence that was input to the channel encoder of the transmitter subsystem.

For convolutional codes, the optimum decoding process amounts to finding the single path through the code trellis that most nearly represents the demodulated bit sequence. The transmitted code digits correspond to a specific path through the trellis. However, the receiver has no knowledge of the exact path and it can only use the received sequence, which possibly has errors, to find the most likely path that corresponds to the received sequence. This most likely path is then used to specify the decoded data sequence that would have generated the path. This procedure is called maximum-likelihood decoding. The Viterbi algorithm is a maximum-likelihood decoding procedure based on finding the trellis path with the smallest distance between its digit sequence and the received sequence. Typically, the distance used is the Hamming distance wherein the Hamming distance between two codewords of the same length is defined as the number of digits that differ in the two sequences. For example, the sequence "011010111" differs from the sequence "111001101 in digits 1, 5,6, and 8, so the Hamming distance is 4.

Over the last several years, the development and use of wireless communications has been significant. In the 1980's, numerous analog cellular networks were implemented, many of which quickly reached capacity limits, especially in the large service areas of metropolitan cities. The wireless telecommunications industry, in anticipation of these limitations, introduced several digital technologies to increase spectral efficiency and enhance wireless communications. The enhancements included the addition of features and services such as facsimile and data transmission and various call handling features. Thus, wireless communication technology has evolved from simple first-generation analog systems for business applications to second-generation digital systems with features and services for residential and business environments. Currently, the third-generation systems are being developed, known as personal communications systems (PCS). These PCS systems will enable the wireless network to deliver telecommunication services, including voice, data, and video, without restrictions on the portable terminal, location in the world, point of access to the network, access technology, or transport methods.

In the digital technologies associated with wireless communications, there are two basic strategies whereby a fixed spectrum resource can be allocated to different users: narrowband channelized systems and wideband systems. Two narrowband systems are the frequency-division multiple access (FDMA) systems and the time-division multiple access (TDMA) systems. In terms of improved capacity, the wideband systems are the better alternative because the entire system bandwidth is made available to each user and is many times larger than the bandwidth required to transmit information. Such systems are referred to as spread spectrum systems.

Among the many multiple-access technologies available for cellular and PCS systems, the digital spread spectrum code-division multiple access (CDMA) technology has been adopted as a standard in North America. The CDMA system reuses the same frequency in all cells to increase the capacity. The CDMA, as used for digital cellular phone applications, comprises an uplink, or mobile to base station link, and a downlink, or base station to mobile link, each having a dedicated band of frequencies. The CDMA channels are defined in terms of a radio frequency (RF) and code sequence. Sixty-four Walsh functions are used to identify the downlink channels, whereas a long pseudo-random noise (PN) code with different time shifts is used to identify the uplink channels.

Code-division multiple access (CDMA) communication systems used by the current generation of wireless telephone networks typically use direct sequence spread spectrum signaling techniques because of the robustness of these systems to interference. The direct sequence spread spectrum system is a wideband system in which the entire bandwidth of the system is available to each user. A direct sequence spread spectrum system, also referred to as a pseudo-noise system, is characterized by a carrier that is modulated by a digital code in which the code bit rate is much larger than the information signal bit rate. Therefore, the bandwidth of the transmitted signal, s(t), is much greater than that of the message, m(t). The spreading of the data is performed by means of a spreading signal, called a code signal, that is independent of the data and is of a much higher rate than the data signal. This means that the spreading signal has a bandwidth much larger than the minimum bandwidth required to transmit the desired information, which for a digital system is the baseband data.

Furthermore, the relatively wide bandwidth of s(t) caused by the independent modulating waveform, of spreading signal c(t), means that the spreading signal must be known by the receiver in order for the message signal, m(t), to be detected. Therefore, despreading is accomplished at the receiver by the cross-correlation of the received spread signal with a synchronized replica of the same signal used to spread the data. Consequently, the complex envelope of the spread spectrum signal is a function of both m(t) and c(t). In the typical case, a product function is used, so that $$g(t) = g_m(t) g_c(t) \quad (1)$$

where $g_m(t)$ and $g_c(t)$ are types of modulation complex envelope functions.

The spread spectrum signals are classified by the type of mapping functions that are used for $g_c(t)$. With a direct sequence spread spectrum system, the information waveform, m(t), typically comes from a digital source so that m(t) is a polar waveform having values of ±1. Furthermore, binary phase shift keyed (BPSK) modulation has $g_c(t) = Ac m(t)$. Thus, for direct sequence where $g_c(t) = c(t)$ is used in equation 1, the complex envelope for the spread spectrum signal becomes $$g(t) = A_c m(t) c(t) \quad (2)$$

The resulting $s(t) = \mathrm{Re}\{g(t)^{j\omega_c t}\}$ is called a binary phase shift keyed data, direct sequence spreading, spread spectrum signal, and c(t) is a polar spreading signal. Moreover, this spreading waveform may be generated by a pseudo-random noise (PN) code generator where the values of c(t) are ±1. The PN code generator typically uses a modulo-2 adder and r clocked shift register stages.

FIG. 2 is a prior art BPSK direct sequence spread spectrum transmitter 200. The transmitter may comprise a source encoder (not shown) coupled to receive an input data sequence. The transmitter 200 comprises a BPSK modulator 202 that is coupled to receive a source encoded input data sequence. The BPSK modulator 202 generates a BPSK signal 204. A spreader 206 is coupled to receive the BPSK signal 204. The spreader 206 outputs a BPSK direct sequence spread spectrum signal 208.

FIG. 3 is a prior art BPSK direct sequence spread spectrum receiver 300. The receiver 300 comprises a despreader 302 that is coupled to receive a transmitted BPSK direct sequence spread spectrum signal along with channel noise 302. The output of the despreader 304 is coupled to a demodulator 306. The demodulator 306 is coupled to provide a demodulated BPSK signal 308 to a decoder (not shown).

Orthogonal functions are typically employed to improve the bandwidth efficiency of a spread spectrum CDMA system. Each mobile user uses one member of a set of orthogonal functions representing the set of symbols used for transmission. While there are many different sequences that can be used to generate an orthogonal set of functions, the Walsh and Hadamard sequences make useful sets for CDMA. Typically, CDMA systems use orthogonal functions for the spreading code on the forward channel and orthogonal functions for the modulation on the reverse channel.

The simplest form of a direct sequence spread spectrum system in the prior art uses coherent binary phase-shift keying (BPSK) for both the data modulation and the spreading modulation. However, the most common form of prior art direct sequence spread spectrum systems use BPSK for the data modulation and quadrature phase-shift keying (QPSK) for the spreading modulation. The Telecommunications Industry Association (TIA) IS-95 CDMA system standard uses pseudo-orthogonal functions for spreads of code on the reverse link. The IS-95 system transmits the same BPSK data on both the in-phase and the quadrature components of the forward and reverse links. One of 64 possible modulation symbols is transmitted for each group of six code symbols, where the modulation symbol is one member of the set of 64 mutually orthogonal functions that are generated using Walsh functions. Walsh functions are generated by codeword rows of special square matrices called Hadamard matrices. The Walsh functions form an ordered set of rectangular waveforms taking only two amplitudes, +1 and −1.

In prior art CDMA cellular applications the uplink, or reverse link, allows all mobile stations accessing a radio system to share the same frequency assignment. Each mobile station uses a different time shift on the PN code so that the radio system can correctly decode the information from an individual mobile station. Data on the reverse channel are convolutionally encoded and block interleaved. The encoded and interleaved data are modulated using six code symbols modulated as one of 64 modulation symbols, wherein the modulation symbol is one of 64 mutually orthogonal waveforms that are generated using Walsh functions. Following this orthogonal spreading, the reverse traffic channel and access channel are spread in quadrature using in-phase and quadrature pilot PN sequences; the spreading modulation is offset-QPSK. No pilot signal is transmitted on the reverse channel.

A third generation of CDMA currently being developed, referred to as wideband CDMA (W-CDMA), supports larger frequency bandwidths and higher data rates in order to overcome the shortcomings of CDMA. The W-CDMA supports QPSK data on the forward and reverse links to improve data throughput. In prior art W-CDMA modulators the in-phase and quadrature signals are separated after convolutional encoding. The in-phase channel adds the pilot channel. The quadrature channel linearly adds the encoded signals. Both the in-phase and quadrature channels are then modulo-2 summed with PN sequences and sent to the modulator resulting in QPSK modulation. The reverse channel may use either 9600-, 4800-, 2400-, or 1200-bps data rates for transmission.

A problem with the current CDMA system is that it employs a non-coherent reverse link. The problem with a non-coherent link in a communications system is that it has a relatively low processing gain which means that the system is bandwidth and power inefficient, resulting in a reduced level of performance relative to higher gain systems. Furthermore, the non-coherent system is unable to support the higher data rates required to support computer communications over the cellular telephone network. Making the W-CDMA system reverse link coherent would provide approximately a 3 decibel gain over the non-coherent system which would result in better performance and, consequently, reduced transmit power. Moreover, a coherent reverse link would support encoding/decoding and modulation/demodulation schemes that would allow for increased data throughput rates and increased robustness to channel noise with a cellular telephone. This would allow for the support of communications over a cellular network that require high data rates, for example computer data and video data transmission. Therefore, an objective of the new W-CDMA system is to employ a coherent reverse link. Furthermore, while meeting the objective of employing a coherent reverse link, the new W-CDMA equipment should be compatible with equipment currently used in the CDMA cellular telephone systems so as to allow maximum reuse of current equipment.

SUMMARY OF THE INVENTION

A method and an apparatus for decoding trellis coded direct sequence spread spectrum communication signals are provided. According to one aspect of the invention, a transmitted QPSK signal is received. Binary phase-shift keyed (BPSK) despreading is performed on the QPSK signal. The BPSK despreading comprises correlating the in-phase and the quadrature components of the received QPSK signal with independent PN sequences for the each of the in-phase and the quadrature components. The despread signal is then demultiplexed, and the pilot signal and the BPSK data signal are recovered. The recovered pilot signal is used to provide a channel phase estimate and a channel magnitude estimate. The recovered BPSK data signal is demodulated, despread, and decoded. The despreading and decoding comprises determining a number of cross-correlation terms of the received signal using a number of transmitted biorthogonal Walsh sequences. The cross-correlation terms are used as the branch metrics in a maximum likelihood decoding algorithm. The branch metrics may be computed with a Fast Walsh Transform scaled in response to the channel phase estimate from the recovered pilot signal. The maximum likelihood decoding algorithm may be a Viterbi algorithm in which the optimum path is the path with the maximum accumulated branch metric. The decoding algorithm recovers and outputs a transmitted data bit sequence.

These and other features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which:

FIG. 12 is the sequence mapping for a trellis coded system in which M=8 in one embodiment.

FIG. 17 is the demapping for the case where M=8 discussed herein with reference to FIG. 12.

DETAILED DESCRIPTION

A method and an apparatus for decoding trellis coded direct sequence spread spectrum communication signals are provided. The method and apparatus described herein may also be used in pattern recognition systems. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention. It is noted that preliminary experiments with the method and apparatus provided herein show significant improvements when compared to typical prior art spread spectrum communication systems.

Figure 1:
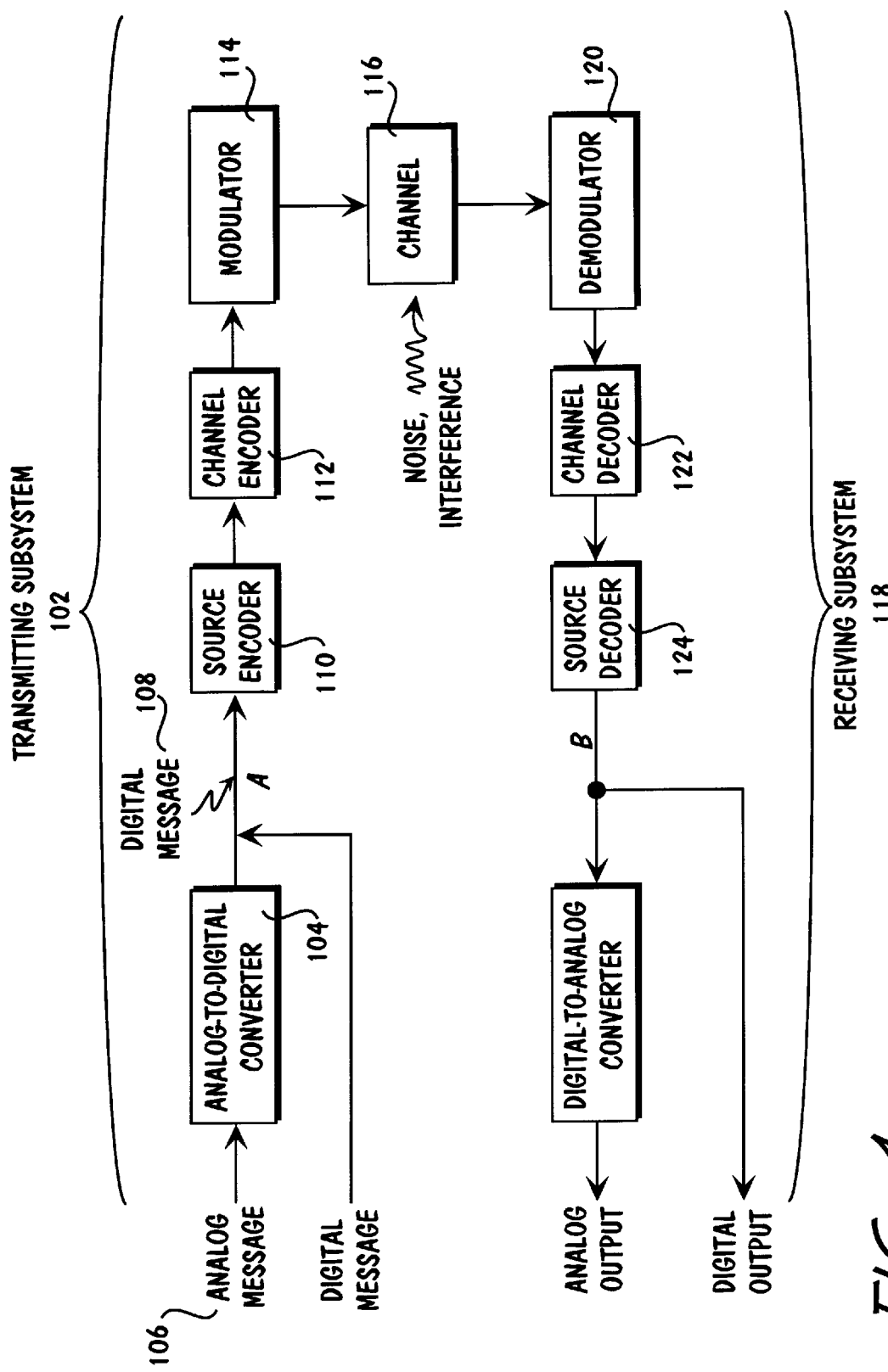
FIG. 1 is a functional block diagram of a prior art communication system.
Figure 2:
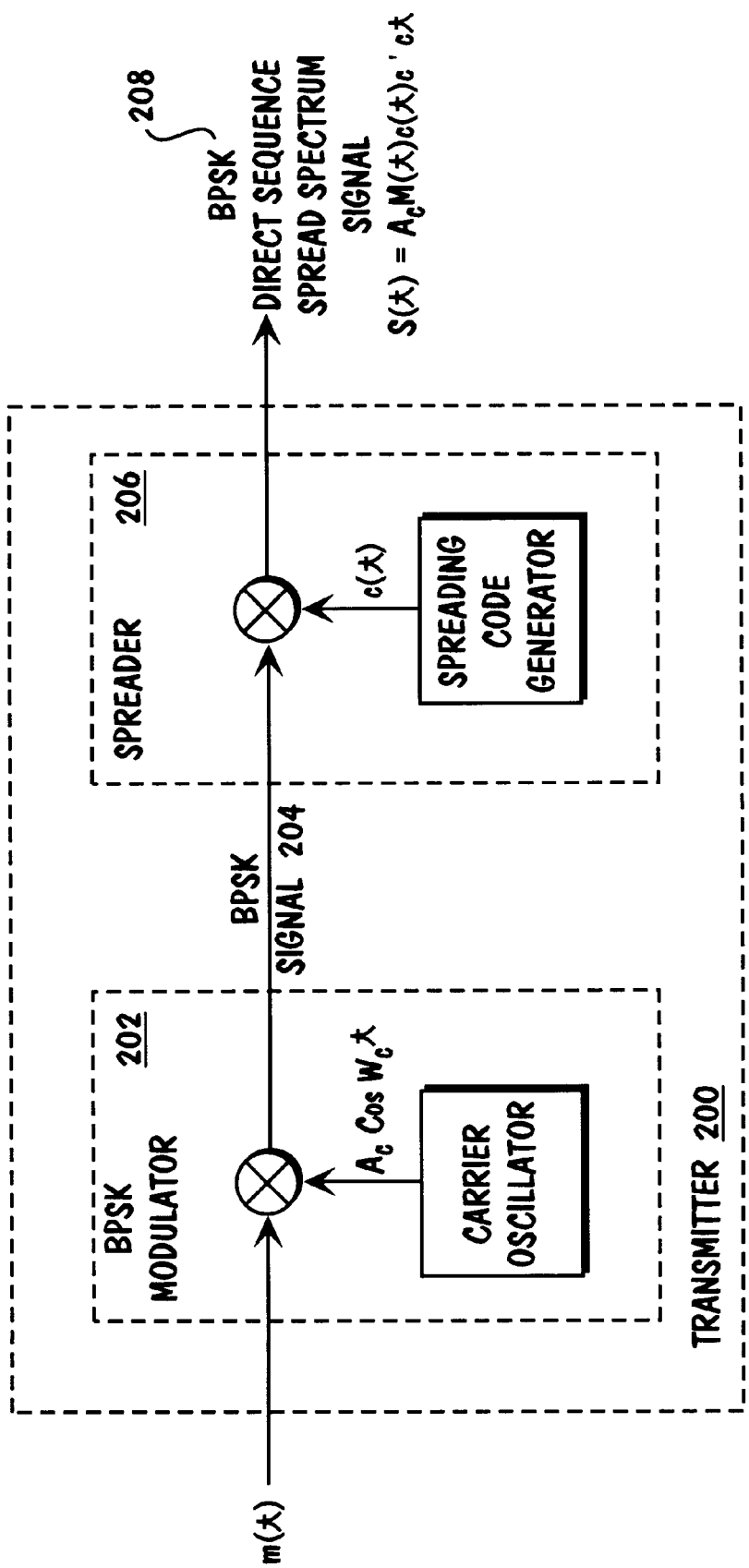
FIG. 2 is a prior art BPSK direct sequence spread spectrum transmitter.
Figure 3:
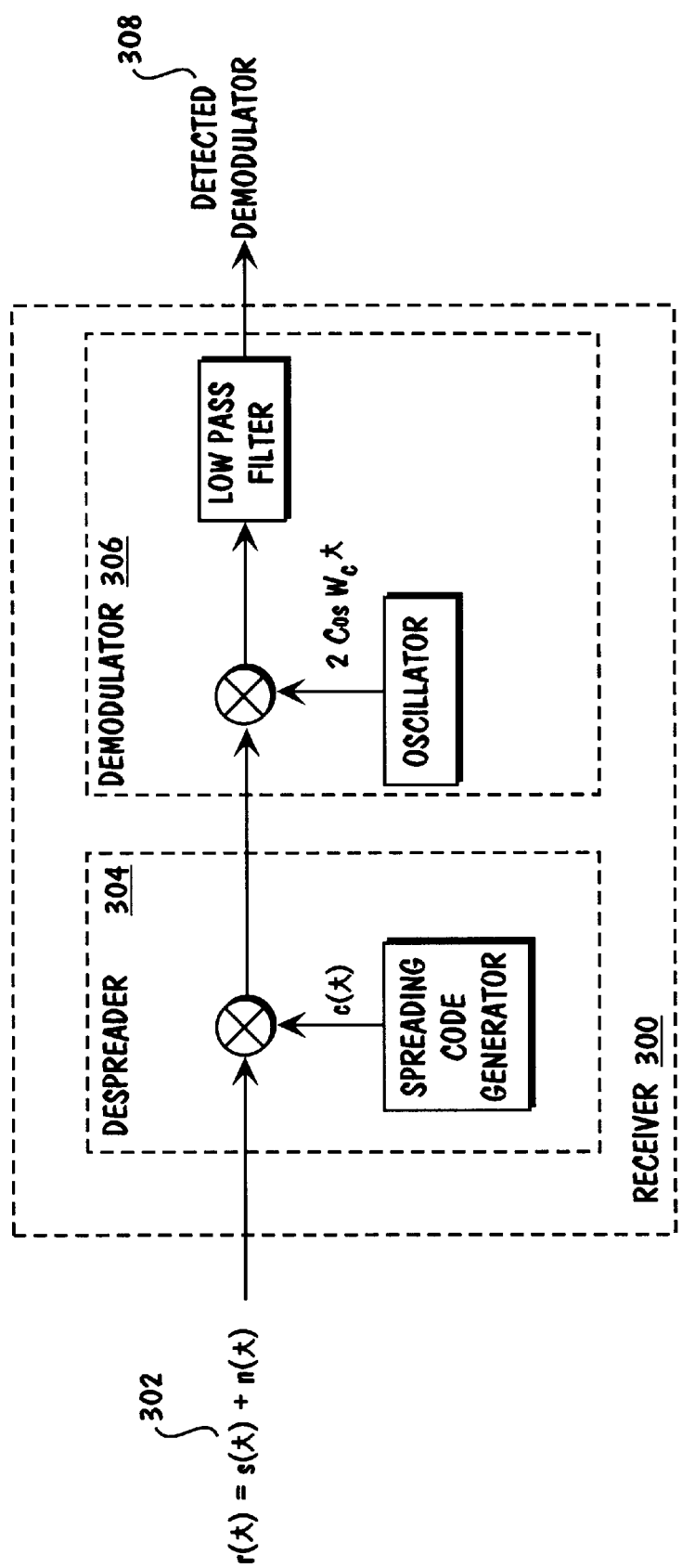
FIG. 3 is a prior art BPSK direct sequence spread spectrum receiver.
Figure 4:
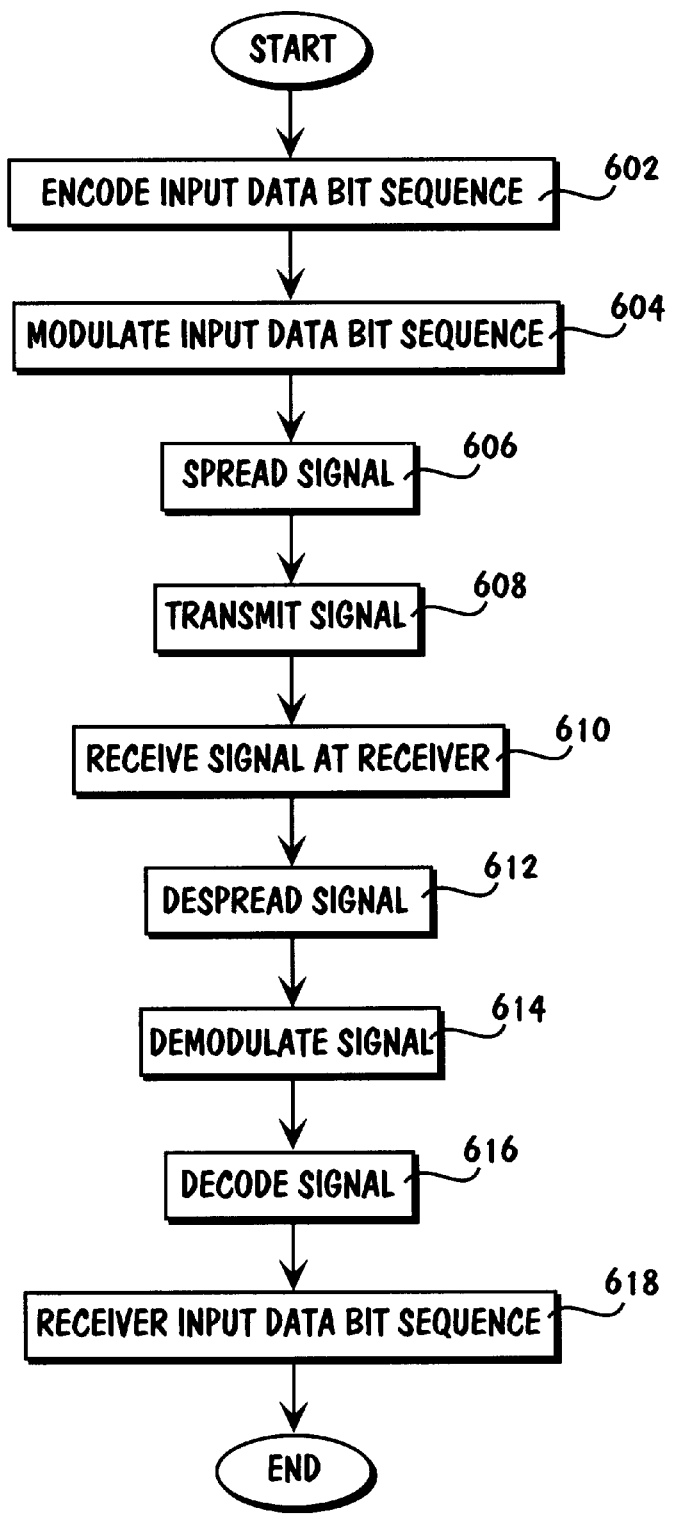
FIG. 4 is a flowchart of the operation of a spread spectrum communication system of one embodiment.

FIG. 4 is a flowchart of the operation of a spread spectrum communication system of one embodiment. This communication system is used for the reverse link of a CDMA cellular telephone system, but is not so limited. Operation begins at step 602, at which a data bit sequence received into a transmitter is channel encoded. The encoded data bit sequence is coupled to be modulated for transmission, at step 604. At step 606, the modulated signal is spread. The spread signal is transmitted, at step 608. The transmitted signal is received by a receiver, at step 610. The receiver despreads the signal, at step 612, and demodulates the despread signal, at step 614. At step 616, the signal is decoded, and the input data bit sequence is recovered, at step 618.

Figure 5:
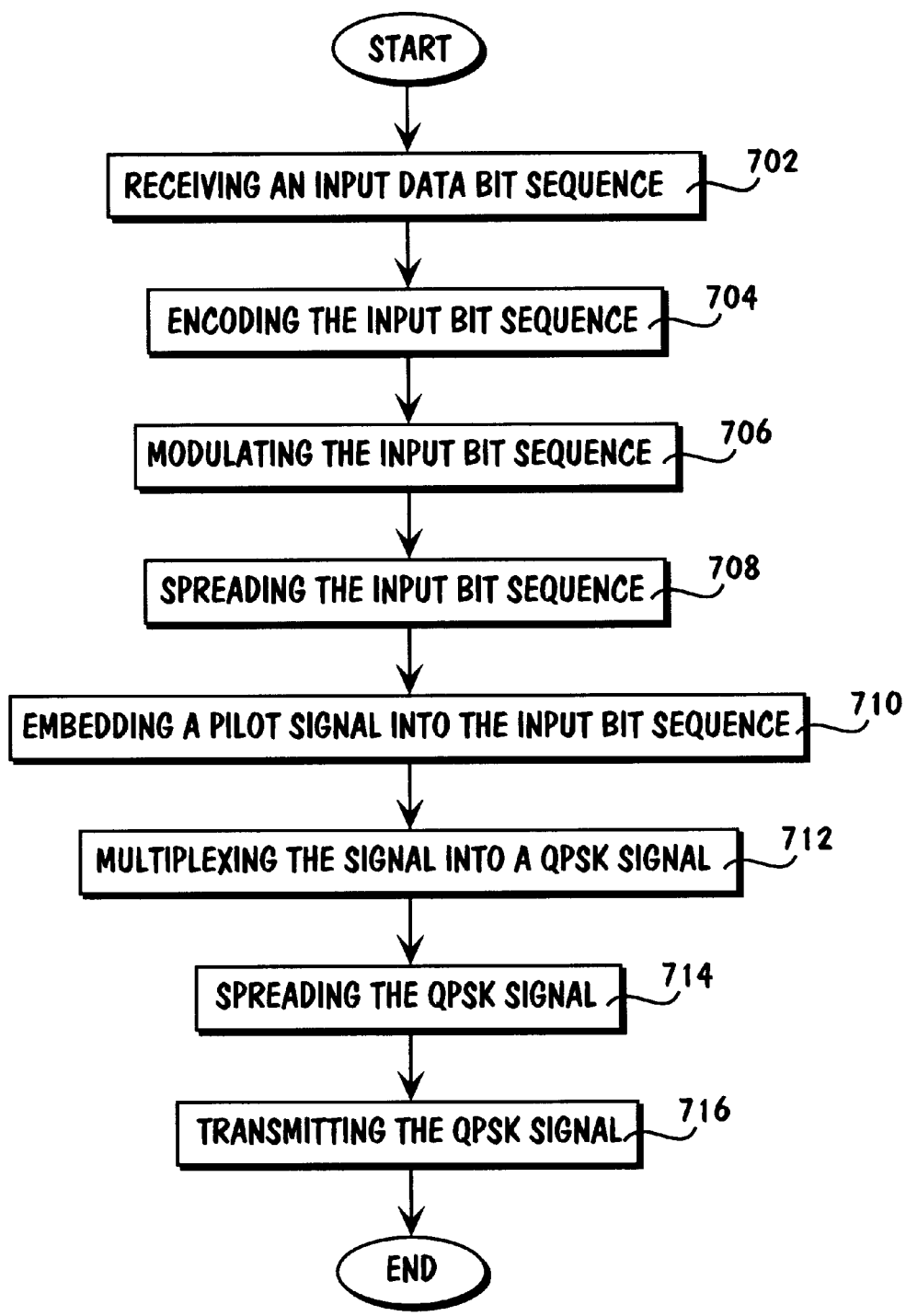
FIG. 5 is a flowchart of the spread spectrum communication system transmitter operation of one embodiment.

FIG. 5 is a flowchart of the spread spectrum communication system transmitter operation of one embodiment. The transmitter in a reverse link cellular telephone system is the mobile unit operated by the user, but the system is not so limited. Operation begins at step 702, at which an input data bit sequence is received into the transmitter. The input data bit sequence may be a sequence of binary data bits representing voice, video, facsimile, and computer data, but is not so limited. The input data bit sequence is encoded and modulated, at steps 704 and 706, respectively. The encoding and modulating steps 704 and 706 are performed using trellis code modulation, but the embodiment is not so limited. The encoding comprises encoding the signal using a convolutional coder having a rate equal to $1/\log_2 (M)$, where M is a number of biorthogonal Walsh sequences. The number of biorthogonal Walsh sequences comprise a Hadamard matrix having dimensions equal to 64-by-64. The convolutional coder of one embodiment has a rate equal to $\frac{1}{3}$, but is not so limited.

A typical direct-sequence communication system has a large number of dimensions per signal. For example, the standard binary direct-sequence system has two antipodal signals spread into N dimensions using a sequence of length N (chips/bit). An embodiment described herein expands the number of possible spreading sequences used. The trellis is then used to allow only certain combinations that have large minimum distance. When the number of sequences is expanded the minimum distance between sequences is decreased, but the trellis code increases the minimum distance of the code above that of the uncoded system. The sequences used herein are expanded from two antipodal sequences to a biorthogonal set of sequences.

At step 708, the encoded and modulated signal is spread to generate a spread signal. The spreading step 708 is accomplished by mapping a number of branches of the trellis code to a number of biorthogonal Walsh sequences. The mapping comprises labeling the branches of the trellis code using the biorthogonal Walsh sequences. This mapping is accomplished by using the output of a convolutional coder as a memory address where the memory address contains one of a number of biorthogonal Walsh sequences. In one embodiment, the spread signal is a binary phase-shift keyed (BPSK) data signal, but is not so limited. Operation continues at step 710, at which a pilot signal is embedded into the spread BPSK data signal. The pilot signal provides phase coherency between the reverse link transmitter and receiver thereby allowing coherent communications and maximum ratio combining in rake receivers by providing a mechanism to estimate the channel response. The BPSK data signal is then multiplexed, at step 712, to form a quadrature phase-shift keyed (QPSK) signal. The QPSK signal comprises an in-phase component generated using at least one even numbered bit of the input data bit sequence and a quadrature component generated using at least one odd numbered bit of the input data bit sequence. The QPSK signal is spread using a pseudo-random noise (PN) sequence, at step 714, prior to being transmitted, at step 716. The PN spreading comprises spreading the in-phase and the quadrature components of the QPSK signal using independent PN sequences for the each of the in-phase and the quadrature components.

Figure 6:
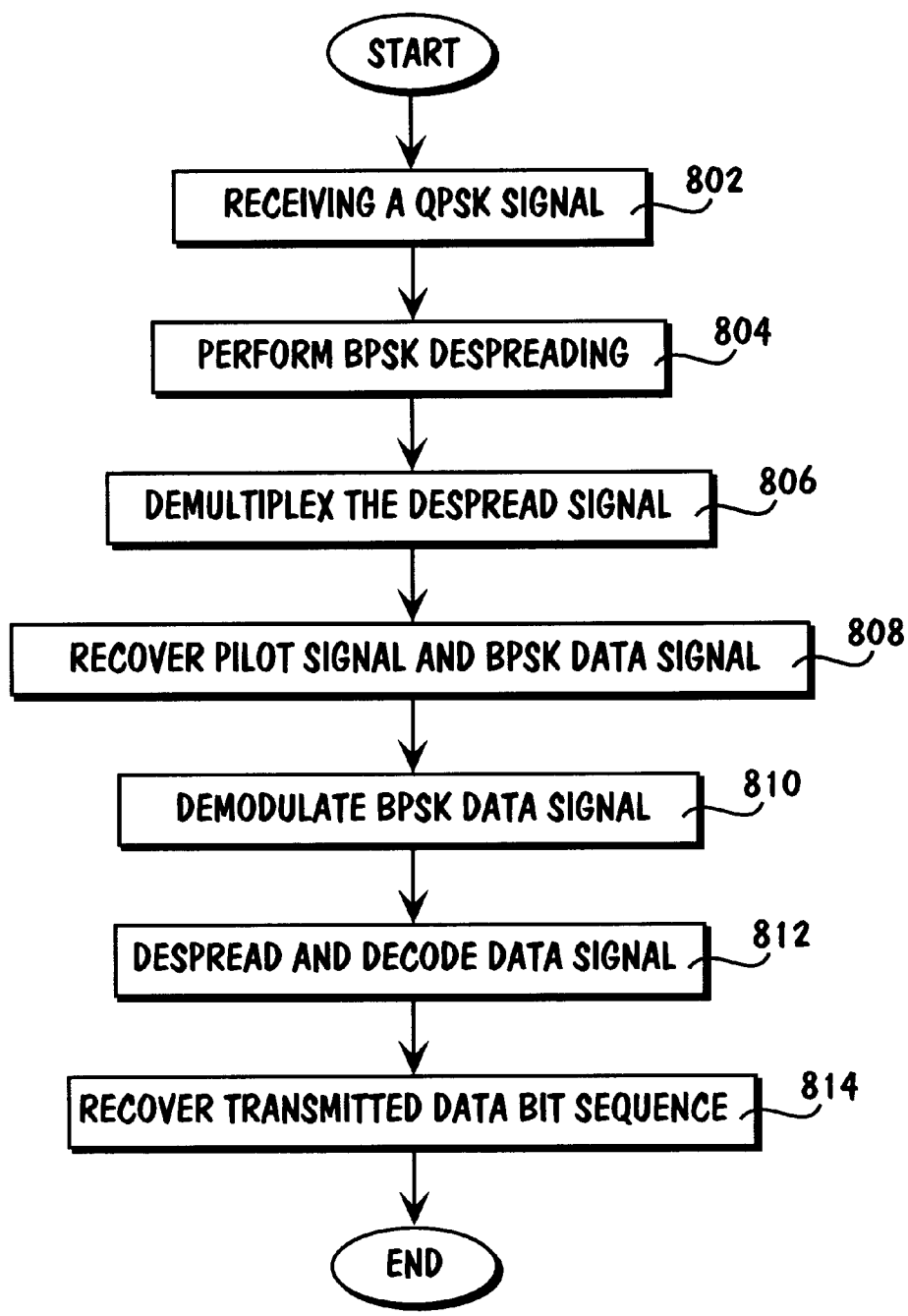
FIG. 6 is a flowchart of the spread spectrum communication system receiver operation of one embodiment.

FIG. 6 is a flowchart of the spread spectrum communication system receiver operation of one embodiment. The receiver in a reverse link cellular telephone system is a base unit, but the system is not so limited. Operation begins at step 802, at which a transmitted QPSK signal is received. The received signal is despread, at step 804. Binary phase-shift keyed (BPSK) despreading is performed on the QPSK signal with the result being recovery of a high rate BPSK signal. The BPSK despreading comprises correlating the in-phase and the quadrature components of the received QPSK signal with independent PN sequences for the each of the in-phase and the quadrature components. The independent PN sequences used are synchronized to the independent PN sequences used to spread the signal in the transmitter. The signal is then demultiplexed, at step 806.

A pilot signal and the BPSK data signal are recovered, at step 808, from the demultiplexed signal. The recovered pilot signal is used to provide a channel phase estimate and a channel magnitude estimate. The recovered BPSK data signal is demodulated, at step 810. At step 812, the demodulated signal is despread and decoded. The despreading and decoding comprises determining a number of cross-correlation terms of the received signal using a number of transmitted biorthogonal Walsh sequences. The cross-correlation terms are used as the branch metrics in a maximum likelihood decoding algorithm. The branch metrics may be computed with a Fast Walsh Transform, or Fast Hadamard Transform, scaled in response to the channel phase estimate from the recovered pilot signal, but the embodiment is not so limited. The maximum likelihood decoding algorithm may be a Viterbi algorithm in which the optimum path is the path with the maximum accumulated branch metric, but the embodiment is not so limited. At step 814, the transmitted input data bit sequence is recovered.

Considerable performance gains are possible in systems that combine the operations of coding and modulation. As such, trellis codes are used in communications systems because typical trellis codes combine the encoding and modulation functions in one operation. As previously discussed herein, a convolutional coder is used to generate the trellis codes. The convolutional coder has a code rate that is the ratio of the number of input bits to the number of output bits.

With the appropriate choice of modulation waveforms, spreading can also be incorporated into the trellis coded modulation along with the channel encoding and modulation. The general rule of trellis coded modulation is that branches exiting and entering a state should have a maximum Euclidean distance. In codes having a rate equal to $1/\log_2 (M)$, where M is the number of biorthogonal signature sequences, the number of branches per state is two. In these codes, the branches of a trellis map into antipodal waveforms. Therefore, a biorthogonal signal set can be generated from a subset of Walsh sequences, the length of which contributes to the overall processing gain.

Figure 7:
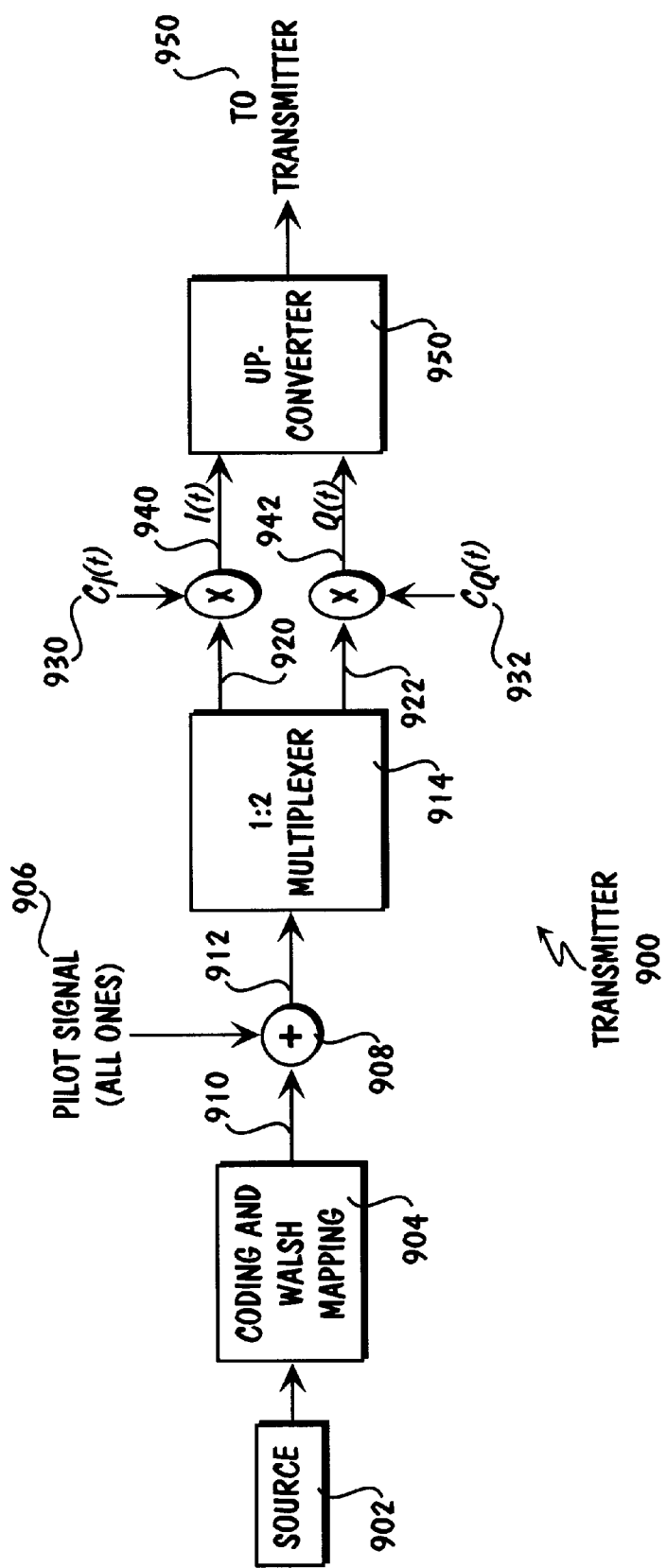
FIG. 7 is a block diagram of a transmitter of one embodiment.

FIG. 7 is a block diagram of a transmitter 900 of one embodiment. An input data bit sequence, or source 902, is coupled to be received into the transmitter. The source may be an analog signal or a digital signal. The input data bit sequence is encoded and modulated using a Walsh modulator 904. The encoding and modulating is performed using a trellis code generated by a convolutional coder, as discussed herein, but the embodiment is not so limited. The encoded and modulated signal is spread by mapping a number of branches of the trellis code to a number of biorthogonal Walsh sequences. In one embodiment, the encoded, modulated, and spread signal is a binary phase-shift keyed (BPSK) data signal 910, but is not so limited. The output 910 of the Walsh modulator 904 is added to a pilot signal 906 and is modulated with a Walsh (0) sequence. In one embodiment, the pilot signal is all ones and the Walsh (0) sequence is all ones, but the embodiment is not so limited; the approach is not dependent on Walsh size (M), but the pilot and Walsh modulated data signals should be of the same order. The pilot signal 906 is embedded into the spread BPSK data signal 910 using an adder 908.

The BPSK data signal containing the pilot signal 912 is then multiplexed using multiplexer 914 to form a quadrature phase-shift keyed (QPSK) signal. The QPSK signal comprises an in-phase component 920 generated using at least one even numbered bit of an input data bit sequence, and a quadrature component 922 generated using at least one odd numbered bit of an input data bit sequence. The QPSK signal is spread using independent pseudo-random noise (PN) sequences $c_I$ 930 and $c_Q$ 932. The PN spreading comprises spreading the in-phase component of the QPSK signal 920 using a first independent PN sequence $c_I$ 930 and spreading the quadrature component of the QPSK signal using a second independent PN sequence $c_Q$ 932. The spread in-phase 940 and quadrature 942 components are then upconverted in frequency using an upconverter 950, and coupled to transmitter 950 where the signals are transmitted.

Figure 8:
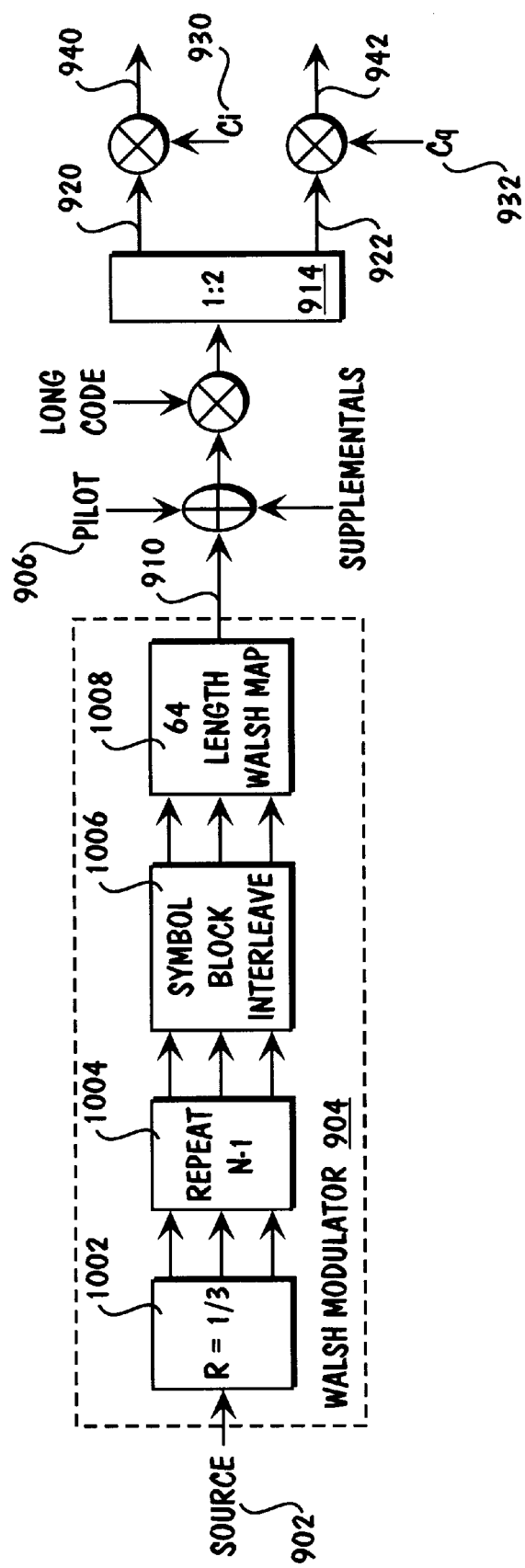
FIG. 8 is a block diagram of a transmitter of one embodiment showing the components of the Walsh modulator.

FIG. 8 is a block diagram of a transmitter 900 of one embodiment showing the components of the Walsh modulator 904. The Walsh modulator receives an input data bit sequence, or source 902, as previously discussed. The Walsh modulator 904 comprises a convolutional coder 1002 having a rate equal to ⅓, but the embodiment is not so limited. The output of the convolutional coder 1002 is coupled to a repeat N-1 device 1004. The output of the repeat N-1 device 1004 is coupled to a symbol block interleave device 1006. The output of the symbol block interleave device 1006 is coupled to a Walsh map 1008 comprising 64 sequences, but the embodiment is not so limited. The output 910 of the Walsh map 1008 is added to a pilot signal 906 as previously discussed.

Figure 9:
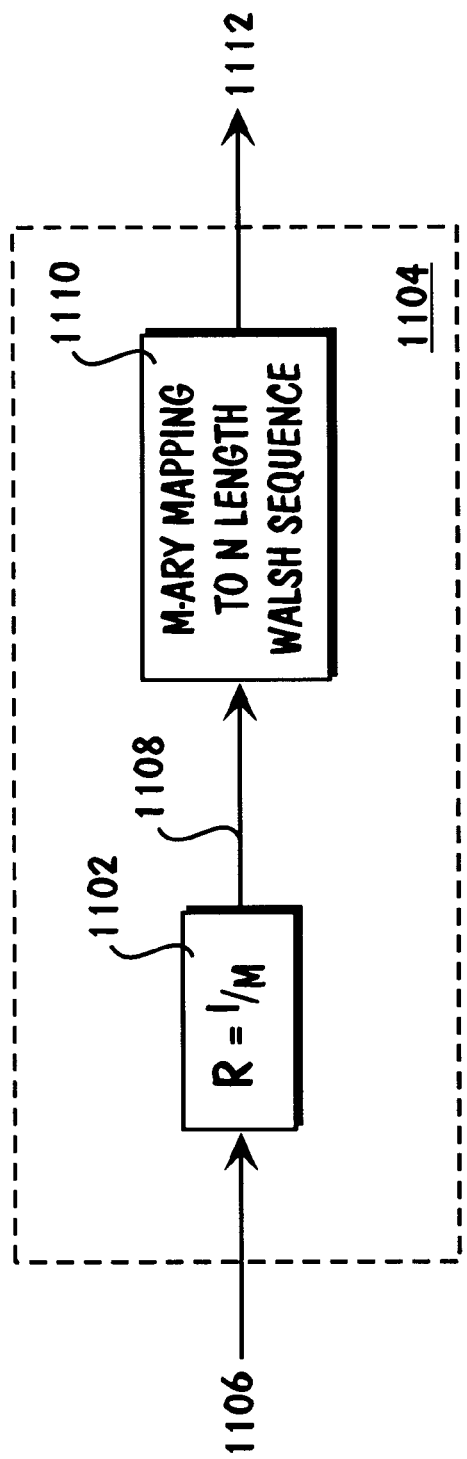
FIG. 9 is a general block diagram of the Walsh modulator of one embodiment.

FIG. 9 is a general block diagram of the Walsh modulator 1104 of one embodiment. Generally, the operation of the Walsh modulator may be divided into two stages. In the first stage, redundancy is added to an input data sequence by means of a convolutional code. In the second stage, the output of the convolutional coder is mapped to a point in some constellation of possible output signals, and that mapped signal point is transmitted. As such, the Walsh modulator 1104 comprises a convolutional coder 1102 of rate 1/log₂ (M) coupled to receive a decimal representation of a code symbol 1106. The convolutional coder 1102 is coupled to provide an output of binary representations of the code symbols 1108. An M-ary sequence mapping device 1110 is coupled to receive the binary representations of the code symbols 1108 and to output a Walsh mapping 1112 in response. Convolutional codes generated by convolutional coder 1102 are restricted to having a rate equal to 1/log₂ (M) and having the property that the Hamming distance between the two branch labels leaving and entering a state is equal to log₂ (M). For this class of codes, each information or data bit entering the coder produces log₂ (M) coded symbols which are mapped to one of a number of spreading sequences. The sequence mapping is obtained using biorthogonal sequences in one embodiment.

The set of M biorthogonal sequences of one embodiment comprises a first set of M/2 orthogonal sequences and a second set of M/2 sequences obtained by complementing the first set of orthogonal sequences. In one embodiment, the set of biorthogonal sequences used are the Walsh sequences in a Hadamard matrix, but the Walsh modulator is not so limited. An M-ary biorthogonal sequence set is obtained from M/2 rows of an N×N Hadamard matrix where M/2 is less than or equal to N. The amount by which N is greater than M/2 determines the spreading ratio and the associated processing gain. The remaining M/2 sequences are obtained by complementing the first M/2 sequences, and this second set of sequences is the antipodal sequence because, in a polarity level representation, complementing is equivalent to negation.

The sequence mapping that completes the signal construction uses two rules from the theory of trellis coded modulation: 1) branch labels leaving a state should have maximum Euclidean distance; and 2) branch labels entering a state should have maximum Euclidean distance. Therefore, one branch leaving a state is assigned a specific Walsh sequence while the other branch leaving the same state is assigned the antipodal of the Walsh sequence assigned to the first branch. Similarly, the procedure holds for branches entering a state.

Figure 10:
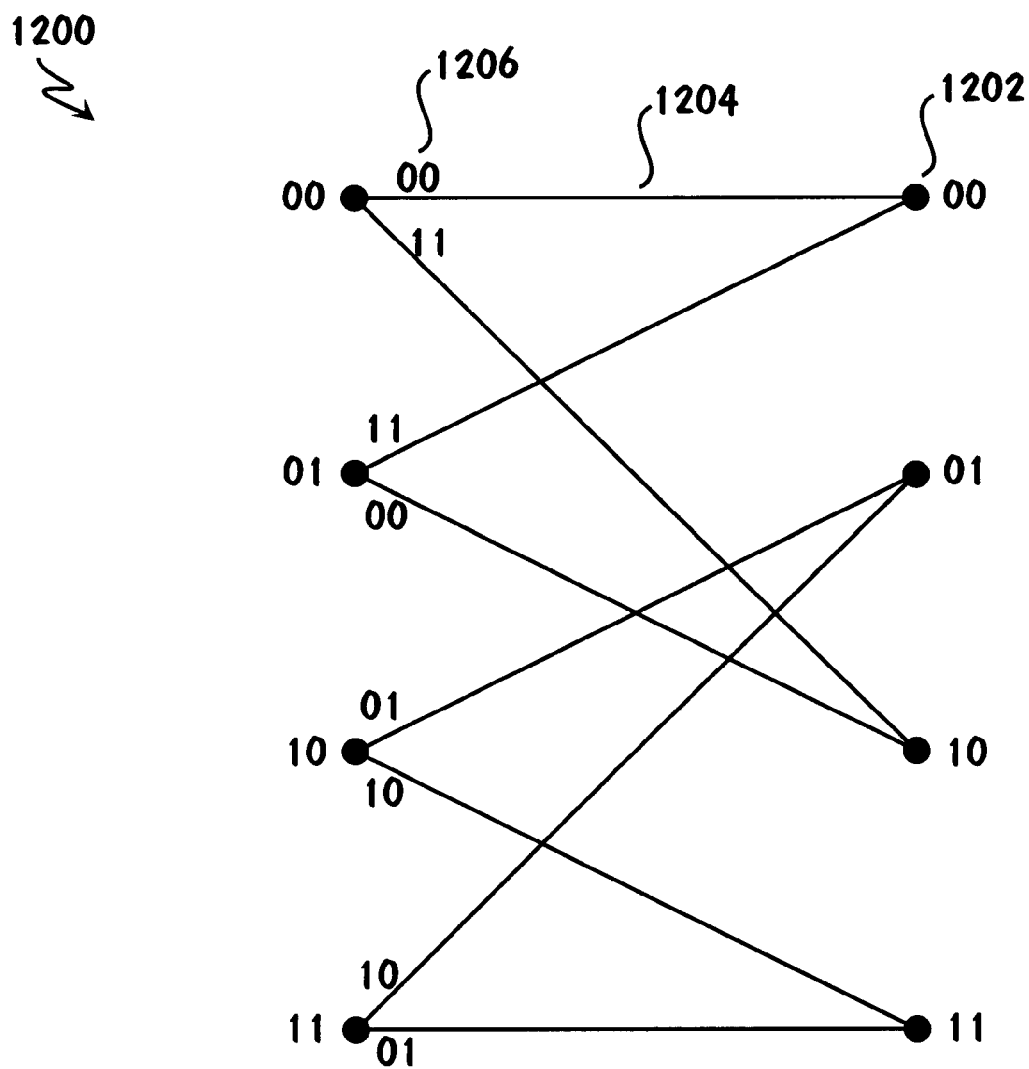
FIG. 10 is a trellis diagram for a trellis code having a rate equal to ½ and a constraint length K equal to 5.
Figure 11:
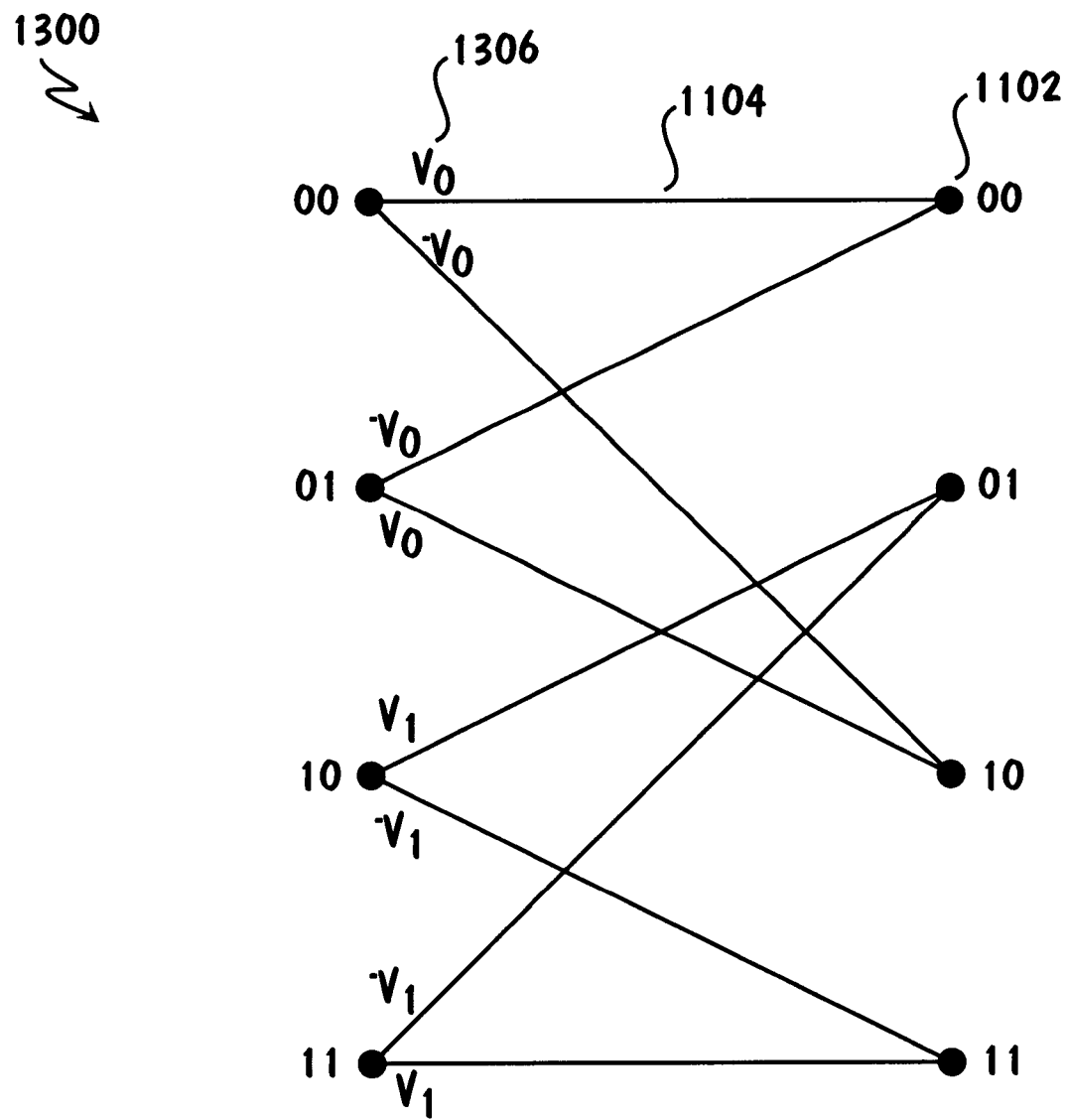
FIG. 11 is a trellis diagram for a trellis code having a rate equal to ½ and a constraint length K equal to 5 after the sequence mapping of one embodiment.

The selected convolutional codes for a coder of rate 1/m allows the mapping to be represented by V(k) for k=0 to [(M/2)−1], where V(k) is M/2 biorthogonal Walsh sequences of length N. Increasing N results in an increased processing gain. The set of Walsh sequences is expanded to M by including the complement of each Walsh sequence, allowing for the transmission of log₂ (M) channel bits. The mapping is given by W=V(d), when d<M/2, where d equals the decimal representation for the coded symbols associated with an information bit, and W equals the Walsh sequence resulting from the mapping. The mapping is given by W=−V(M/2−1−d) when the constraint d<M/2 is not satisfied. FIG. 10 is a trellis diagram 1200 for a trellis code having a rate equal to ½ and a constraint length K equal to 5. Trellis 1200 comprises a number of states 1202 wherein each state has two branches 1204 exiting the state, as discussed herein. Each branch 1204 exiting a state 1202 is assigned a coded symbol 1206. FIG. 11 is a trellis diagram 1300 for a trellis code having a rate equal to ½ and a constraint length K equal to 5 after the sequence mapping of one embodiment. The coded symbol 1206 of each branch 1204 has been replaced with a Walsh sequence 1306 as discussed herein. FIG. 12 is the sequence mapping for a trellis coded system in which M=8 in one embodiment.

Figure 13:
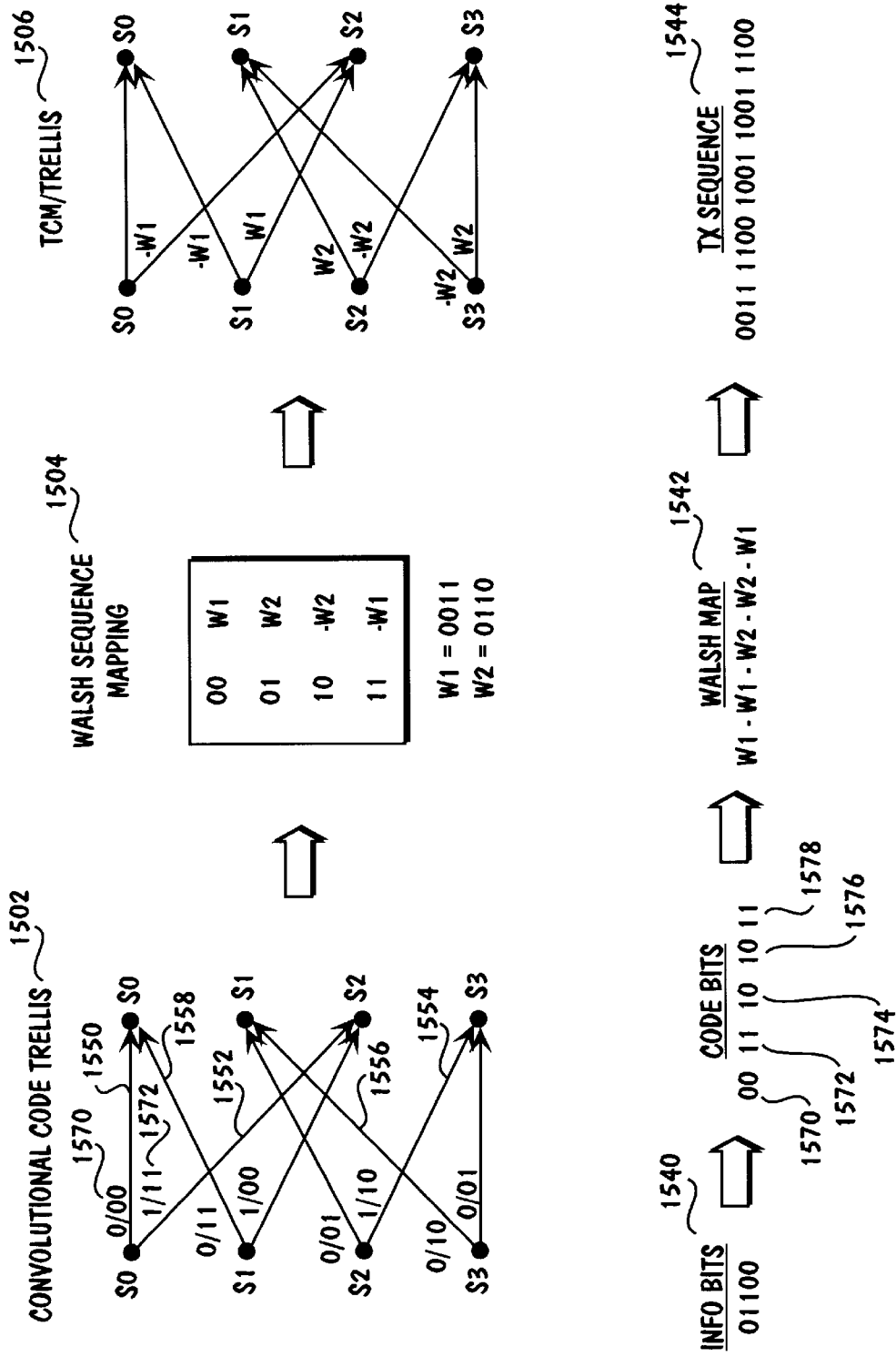
FIG. 13 shows an encoding example using the encoder of one embodiment.

FIG. 13 shows an encoding example using the encoder of one embodiment. This example comprises a four-state convolutional code having a rate equal to ½, where W1 and W2 are two orthogonal Walsh sequences of length N=4 having W1=0011 and W2=0110. This example uses a four-state convolutional code trellis 1502 having states S0, S1, S2, and S3. Information bits 1540 are input into the code trellis. With the trellis starting in state S0, the first information bit input of "0" results in a transition 1550 to state S0 and an output of code bits "00" 1570. Starting at state S0, the second information bit of "1" is input resulting in a transition 1552 to state S2 and an output of code bits "11" 1572. Starting at state S2, the third information bit of "1" is input resulting in a transition 1554 to state S3 and an output of code bits "10" 1374. Starting at state S3, the fourth information bit of "0" is input resulting in a transition 1556 to state S1 and an output of code bits "10" 1576. Starting at state S1, the fifth information bit of "0" is input resulting in a transition 1558 to state S0 and an output of code bits "11" 1578.

The pairs of output code bits 1570–1578 are associated with a Walsh sequence using Walsh sequence mapping 1504. Walsh sequence mapping 1504 is applied to the convolutional code trellis 1502 and the trellis branches are labeled with a corresponding Walsh sequence to create a trellis code modulation (TCM) trellis 1306. Using the Walsh sequence mapping 1504, output code "00" is assigned Walsh sequence mapping W1, output code "01" is assigned Walsh sequence mapping W2, output code "10" is assigned Walsh sequence mapping −W2, and output code "11" is assigned Walsh sequence mapping −W1. With the Walsh sequence mapping 1504 applied, the Walsh map 1542 corresponding to the input sequence "01100" information bits 1540 is W1, −W1, −W2, −W2, and −W1, respectively. Therefore, the transmit sequence 1344 is "0011 1100 1001 1001 1100" for an input sequence "01100". Thus, the encoder of one embodiment extends the code construction to low rate convolutional codes, which includes as a special case the current generation IS-95 reverse link convolutional encoder having a rate equal to ⅓ and a constraint length, K, equal to nine. This superior coding technique, therefore, maintains a large degree of compatibility with the existing standard.

Figure 14:
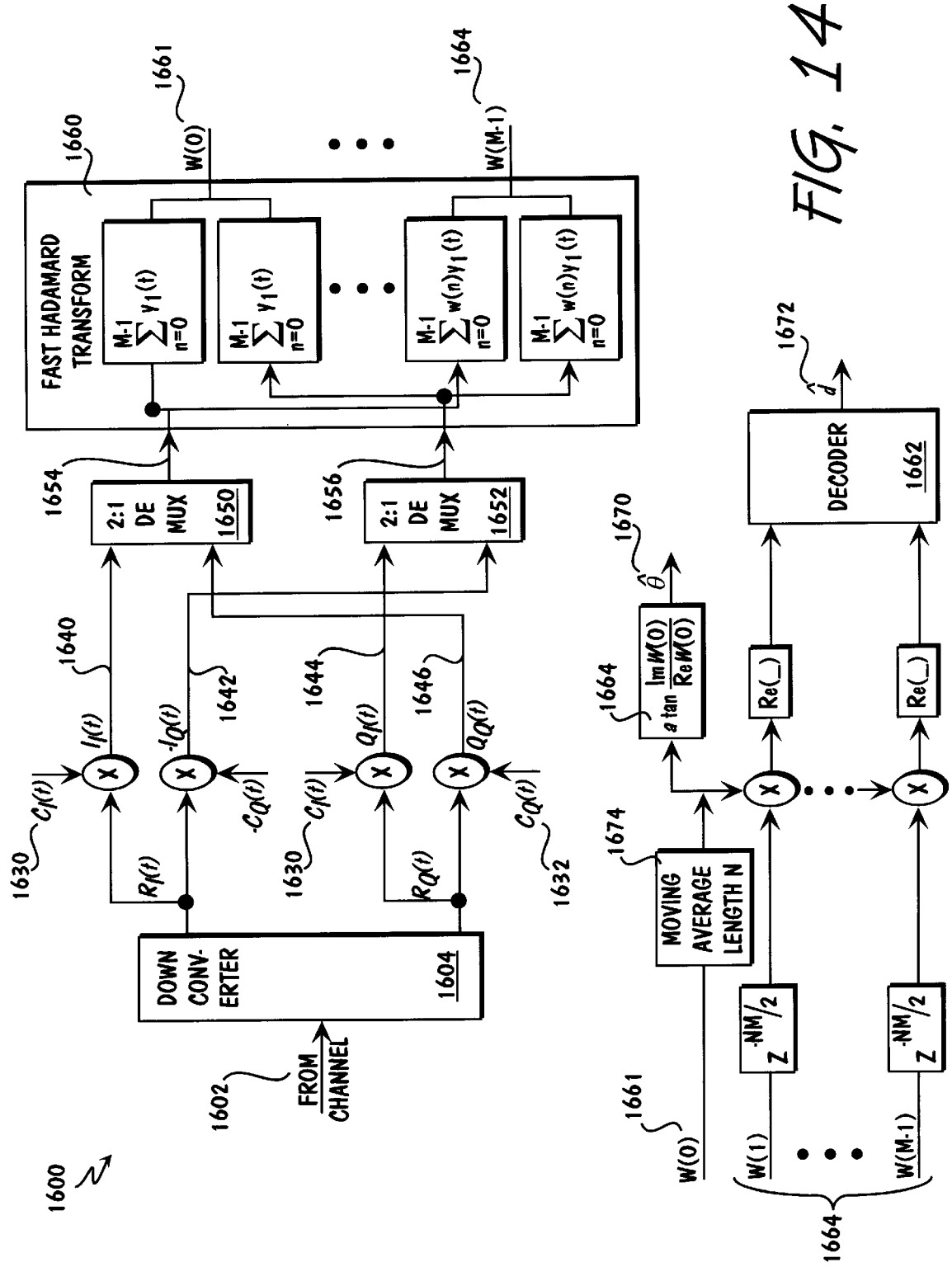
FIG. 14 is the receiver of one embodiment.

When the transmitted QPSK signal is received, a demodulator described herein uses BPSK demodulation to achieve the same data throughput as QPSK demodulation while allowing the benefits of BPSK demodulation techniques. FIG. 14 is the receiver 1600 of one embodiment. The receiver 1600 downconverts the received signal 1602, using downconverter 1604, thereby providing a complex base band signal. The in-phase (I) and quadrature (Q) terms, $R_I$ (t) 1604 and $R_Q$ (t) 1606, respectively, are each correlated with local PN sequences 1630 and 1632, respectively. In one embodiment the local PN sequences 1630 and 1632 are the local PN sequences used at the transmitter. The $R_I c_I$ 1640 and $R_Q c_Q$ 1646 terms are demultiplexed using demultiplexer 1650 to form the $y_I$ terms 1654. Furthermore, the $R_I c_Q$ 1642 and $R_Q c_I$ 1644 terms are demultiplexed using demultiplexer 1552 to form the $y_Q$ terms 1656. These demultiplexed signals 1654 and 1656 are then sent to the Fast Hadamard Transform (FT) 1660 for processing.

The output of the FHT transform 1660 is used to recover the pilot signal 1670 by integrating over the length of the Walsh size (M). In one embodiment, the pilot signal is recovered using the Walsh (0) sequence 1661, but the embodiment is not so limited. It should be noted that the estimation interval may be extended to incorporate multiple Walsh symbols to reduce the phase estimation variance. This is typically done using a moving average of length N 1674. The output of device 1664 provides the phase estimate. A data bit sequence 1672 is attained from the output of the decoder using the output of the other Walsh symbols 1664 in the decoder. Moreover, the output of the pilot signal integration in one embodiment can be conjugated and multiplied by each term of the FHT so that maximum likelihood combining can be used prior to decoding by the decoder 1662.

Figure 15:
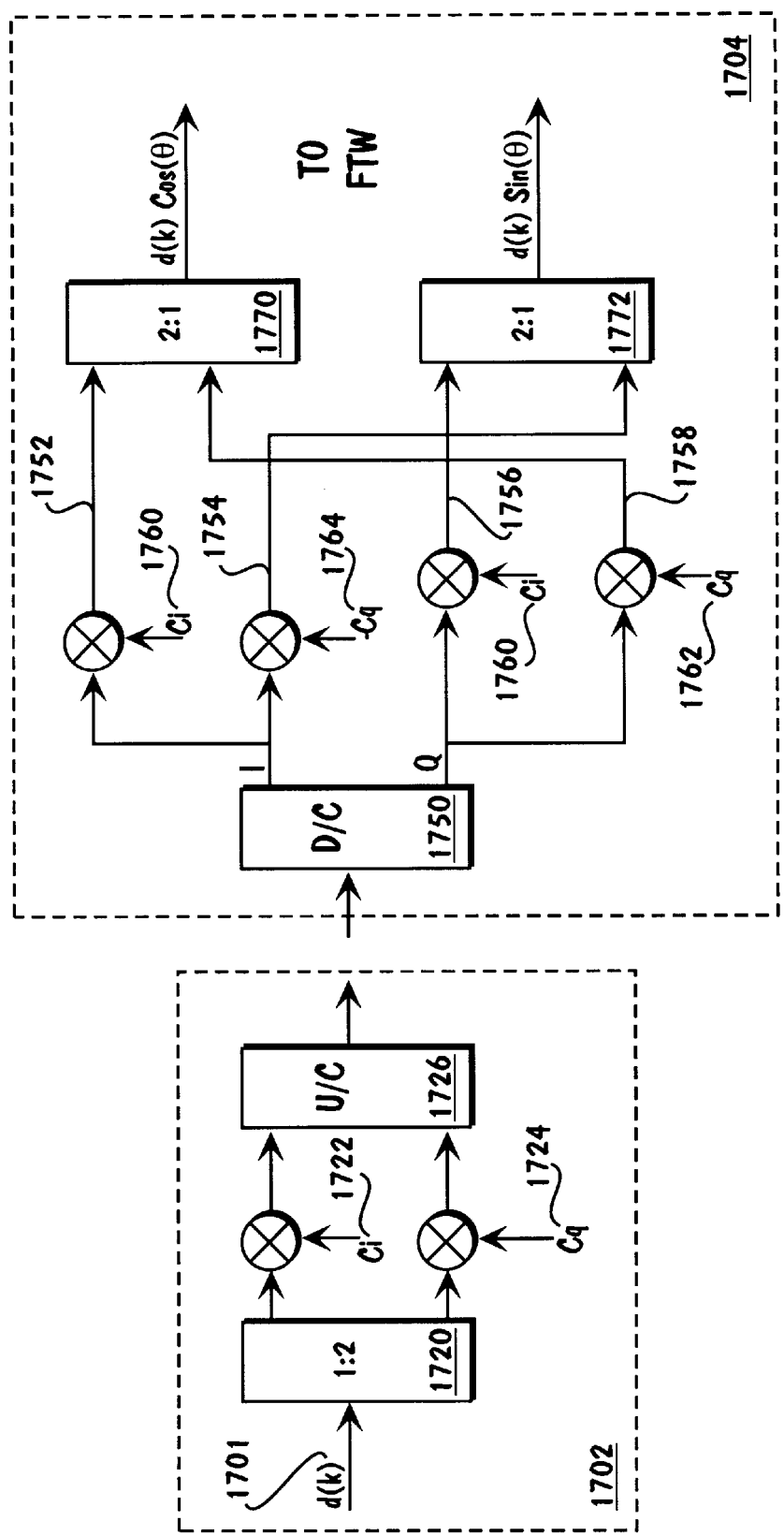
FIG. 15 is the implementation of a BPSK demodulator for a QPSK-spread QPSK signal in one embodiment.

FIG. 15 is the implementation of a BPSK demodulator for a QPSK-spread QPSK signal in one embodiment. The transmitter 1702 receives an input data bit sequence d(k) 1701 into a multiplexer 1720. The multiplexer 1720 generates a QPSK data signal and spreads the signal using in-phase $c_I$ 1722 and quadrature $c_Q$ 1724 PN spreading sequences. The QPSK spread signal has $$I(t)=d_I(t)c_I(t) \quad (3)$$

$$Q(t)=d_Q(t)c_Q(t) \quad (4)$$

where $d_I$ and $d_Q$ are the coded data streams which have been multiplexed into two separate data paths, and $c_I$ 1722 and $c_Q$ 1724 are the in-phase and quadrature PN spreading sequences, respectively. The signal is then upconverted, typically to an intermediate frequency (IF) and then to RF, using upconverter 1726. The upconverted signal is transmitted over a channel.

The transmitted signal, after passing through the channel, is received by the receiver 1704 where it is downconverted using downconverter 1750. The downconverted signal is given as $$R_I(t)=d_I(t)c_I(t)\cos\theta - d_Q(t)c_Q(t)\sin\theta \quad (5)$$

$$R_Q(t)=d_I(t)c_I(t)\sin\theta + d_Q(t)c_Q(t)\cos\theta \quad (6)$$

In performing the demodulation in the receiver 1704, it is assumed that the phase is constant over the chip period. It is assumed that timing has been recovered so that the receiver estimates the carrier phase error (θ) introduced by the channel and recovers the transmitted data, d. To attain a phase estimate and recover the transmitted data the received signals $R_I$ (t) 1742 and $R_Q$ (t) 1744 are despread with both PN codes $c_I$ (t) 1760 and $c_Q$ (t) 1762, respectively, which are assumed to be synchronized to the transmitter, producing four terms $I_I$ 1752, $I_Q$ 1754, $Q_I$ 1756, and $Q_Q$ 1758, where $$I_I(t)=R_I(t)c_I(t) \quad (7)$$

$$I_Q(t)=R_I(t)c_Q(t) \quad (8)$$

$$Q_I(t)=R_Q(t)c_I(t) \quad (9)$$

$$Q_Q(t)=R_Q(t)c_Q(t) \quad (10)$$

Using equations 5 and 6 with equations 7 and 8 gives $$I_I(t)=d_I(t)\cos\theta - d_Q(t)c_I(t)c_Q(t)\sin\theta \quad (11)$$

$$I_Q(t)=d_I(t)c_I(t)c_Q(t)\cos\theta + d_Q(t)\sin\theta \quad (12)$$

$$Q_I(t)=d_I(t)\sin\theta + d_Q(t)c_I(t)c_Q(t)\cos\theta \quad (13)$$

$$Q_Q(t)=d_I(t)c_I(t)c_Q(t)\sin\theta + d_Q(t)\cos\theta \quad (14)$$

The phase information and data are recovered by demultiplexing the $I_I(t)$ data 1752 and the $Q_Q(t)$ data 1758 in order using multiplexer 1770, and by demultiplexing the $I_Q(t)$ data 1754 and the $Q_I(t)$ data 1756 in order using multiplexer 1772. Therefore, the first data out of the multiplexer 1770 for $y_I(t)$ is $I_I(t)$ followed by $Q_Q(t)$, and the first data out of the multiplexer 1772 for $y_Q(t)$ is $Q_I(t)$ followed by $-I_Q(t)$.

Figure 16:
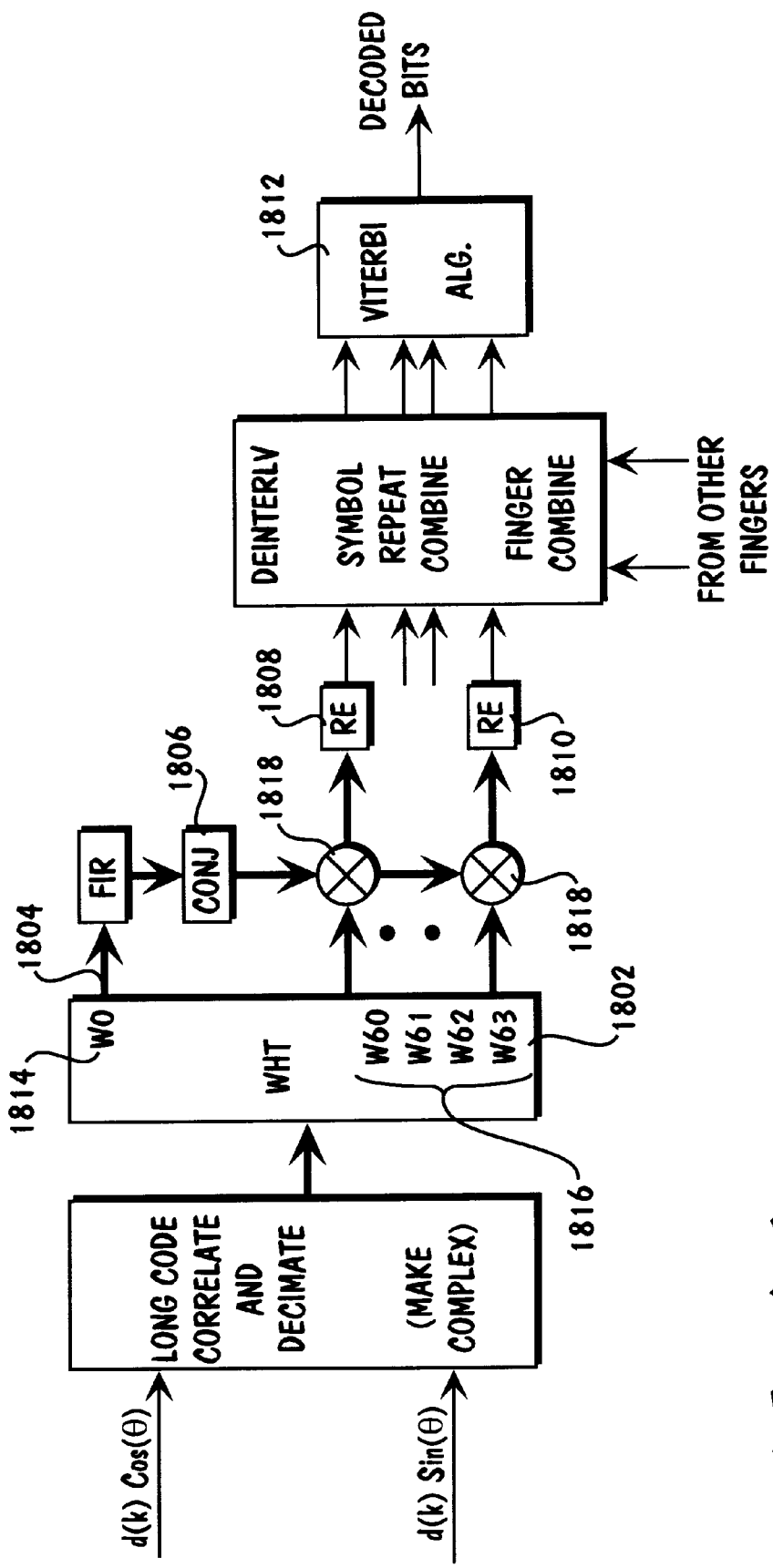
FIG. 16 is the channel estimation and maximal ratio combining in the receiver of one embodiment.

FIG. 16 is the channel estimation and maximal ratio combining in the receiver of one embodiment. With reference to FIG. 15, the $y_I(t)$ and $y_Q(t)$ terms from the multiplexers 1770 and 1772, respectively, are coupled to the FHT 1802, or FWT, where the pilot and data are recovered. The pilot in this case is overlaid with the Walsh (0) sequence 1814. The pilot signal 1804, attained using the W(0) sequence 1814, is used to as a channel estimate of the phase and magnitude of the received signal. This channel estimate is used to rotate and scale, based on current channel conditions, the other Walsh components 1816 of the FHT prior to being sent to the decoder. The rotating and scaling is performed by delaying each component of the FHT in order to center the data with the phase estimate interval. The delayed components are then each multiplied 1818 by the complex conjugate 1806 of the pilot signal. The real part 1808 and 1810 of each component is sent to the decoder 1812 when soft decisions are required; otherwise the maximum component of the phase-compensated FHT is found given the hard decision.

Therefore, the receiver of one embodiment provides a novel approach to attain a phase estimate when using QPSK data, comprising an embedded pilot signal, transmitted on two-quadrature channels and recovered using BPSK demodulation. The transmitter and receiver techniques discussed herein may be incorporated into all of the currently proposed wideband CDMA systems. The techniques discussed herein provide twice the processing gain because the input data sequence is multiplexed onto both QPSK channels. In addition since BPSK demodulation is used to recover QPSK data, the approach is more robust to phase noise then QPSK demodulation techniques.

Following signal demodulation, detection at the receiver requires despreading and decoding operations. Maximum likelihood decoding of convolutional codes is typically accomplished using the Viterbi algorithm in one embodiment. This algorithm requires the computation of branch metrics which are further used in path metric calculations and optimization. As the trellis code modulation of one embodiment combines the encoding and spreading by way of the sequence mapping, despreading and performing branch metric calculation are the same operation. For the case where k=0 to [(M/2)−1], C(k) equals the cross-correlation of the received signal with the biorthogonal sequences V(k) over one information bit duration. Using the mapping of one embodiment discussed herein, C(k) is used directly as the branch metrics where C(k) corresponds to particular branch labels. FIG. 17 is the demapping for the case where M=8 discussed herein with reference to FIG. 12. Using these branch metrics, the Viterbi algorithm is executed and the optimum path is the path with the maximum accumulated branch metric.

Figure 18:
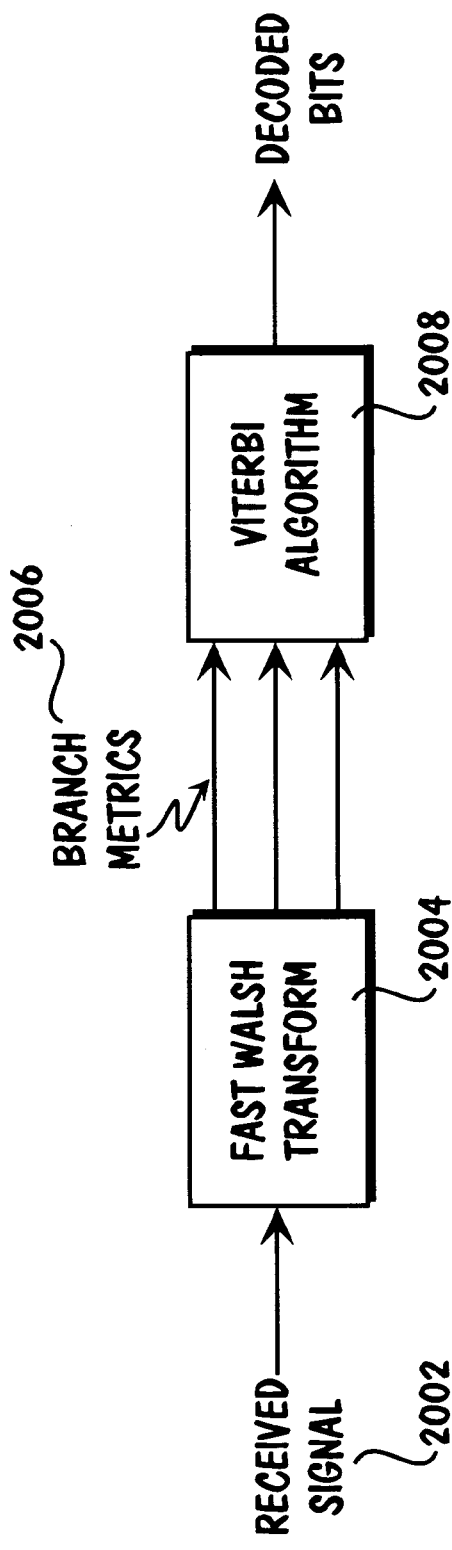
FIG. 18 is the trellis-coded direct sequence spread modulation decoder of one embodiment.

FIG. 18 is the trellis-coded direct sequence spread modulation decoder of one embodiment. For computational efficiency, the branch metrics can be computed using a Fast Walsh Transform (FWT) 2004. Therefore, the received signal 2002, following demodulation in the receiver of one embodiment, is coupled to be processed using a Fast Walsh Transform 2004. The branch metrics 2006 resulting from processing by the FWT are coupled to be processed using a Viterbi algorithm 2008. Because of the biorthogonal nature of the spreading sequences, the number of branch metric calculations is reduced by 50% relative to the number of calculations required for orthogonal spreading. The output of the Viterbi algorithm is the decoded information bit sequence that was transmitted.

The current IS-95 reverse link modulation uses non-coherent orthogonal modulation with Walsh sequences. As such, current base station receivers already implement a FWT. Consequently, using the IS-95 convolutional code, having a rate equal to ⅓, with the combined coding and spreading modulation of one embodiment will offer compatibility as well as enabling maximum reuse of current base station hardware.

Thus, a method and apparatus for decoding trellis coded direct sequence spread spectrum communication signals have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for spread spectrum communication, the method comprising the steps of:
    demodulating a received signal; and
    despreading and decoding the received signal, wherein the despreading and decoding comprises determining a plurality of cross correlation terms of the received signal with a plurality of transmitted biorthogonal Walsh sequences, the plurality of cross correlation terms used as branch metrics in a maximum likelihood decoding algorithm.

2. The method of claim 1, wherein the branch metrics are computed with a Fast Walsh Transform.

3. The method of claim 1, wherein the maximum likelihood decoding algorithm is a Viterbi algorithm, and wherein the optimum path is the path with the maximum accumulated branch metric.

4. The method of claim 1, wherein the received signal is received over a reverse link between a transmitter and a receiver.

5. The method of claim 1, further comprising the step of receiving a pilot signal, the pilot signal providing phase coherency.

6. The method of claim 1, further comprising the step of transmitting the received signal, wherein the step of transmitting comprises the steps of:
    encoding and modulating an input signal using a trellis code; and
    spreading the input signal to generate a spread signal by mapping a plurality of branches of the trellis code to a plurality of biorthogonal Walsh sequences, the mapping comprising labeling the plurality of branches of the trellis code with the plurality of biorthogonal Walsh sequences.

7. The method of claim 6, wherein the transmitted signal is a binary phase shift keyed (BPSK) signal.

8. The method of claim 7, further comprising the steps of:
    embedding a pilot signal into the BPSK data signal;
    multiplexing the BPSK data signal to form a quadrature phase shift keyed (QPSK) signal; and
    spreading the QPSK signal.

9. The method of claim 8, further comprising the steps of:
    performing BPSK despreading on the received QPSK signal;
    demultiplexing the despread BPSK signal, wherein the pilot signal and the BPSK data signal are recovered;
    providing a channel phase estimate and a channel magnitude estimate in response to the recovered pilot signal;
    scaling a Fast Hadamard Transform in response to the channel phase estimate; and
    recovering an input data bit sequence using the scaled Fast Hadamard Transform.

10. The method of claim 6, wherein the step of mapping comprises using the output of a convolutional coder as a memory address, the memory address containing one of the plurality of biorthogonal Walsh sequences.

11. The method of claim 6, wherein the step of encoding and modulating comprises the step of encoding the at least one signal using a convolutional coder having a rate equal to $1/\log_2 (M)$, where M is the number of biorthogonal Walsh sequences.

12. A receiver for spread spectrum communication, the receiver comprising:
    a device for despreading and decoding a received signal, wherein the despreading and decoding comprises determining a plurality of cross correlation terms of the received signal with a plurality of transmitted biorthogonal Walsh sequences;
    a decoding algorithm, wherein the cross correlation terms are used as branch metrics.

13. The receiver of claim 12, further comprising a demodulator for demodulating the at least one received signal.

14. The receiver of claim 12, wherein the branch metrics are computed using a Fast Walsh Transform.

15. The receiver of claim 12, wherein the decoding algorithm is a Viterbi algorithm, and wherein an optimum path is the path having a maximum accumulated branch metric.

16. The receiver of claim 12, wherein the receiver is phase coherent with a transmitter.

17. The receiver of claim 12, wherein the received signal has a rate equal to $1/\log_2 (M)$, where M is the number of biorthogonal Walsh sequences.

18. The receiver of claim 12, further comprising a despreading device performing BPSK despreading on a received QPSK signal to generate a BPSK signal, wherein the received QPSK signal comprises a multiplexed BPSK data signal with an embedded pilot signal.

19. The receiver of claim 18, wherein the BPSK despreading comprises correlating the in-phase and the quadrature components of the received QPSK signal with a plurality of independent pseudo-random noise sequences, the plurality of independent pseudo-random noise sequences synchronized to a transmitter of the received QPSK signal.

20. A spread spectrum communications system comprising a phase coherent receiver, wherein the receiver comprises:
- a device for despreading and decoding at least one received signal, wherein the despreading and decoding comprises determining a plurality of cross correlation terms of the received signal with a plurality of transmitted biorthogonal Walsh sequences; and
- a decoding algorithm, wherein the cross correlation terms are used as branch metrics.

21. The system of claim 20, further comprising a phase coherent transmitter, wherein the transmitter comprises:
- at least one channel encoder and modulator, the channel encoder and modulator using a trellis code; and
- a spreading device that generates a BPSK data signal, the spreading device mapping a plurality of branches of the trellis code to a plurality of biorthogonal Walsh sequences, the mapping comprising labeling the plurality of branches of the trellis code with the plurality of biorthogonal Walsh sequences.

22. The system of claim 21, wherein the channel encoder and modulator comprise a convolutional coder having a rate equal to $1/\log_2(M)$, where M is the number of biorthogonal Walsh sequences.

23. The system of claim 21, wherein the spreading device comprises a lookup table containing the plurality of Walsh sequences, the spreading device addressing a plurality of elements of the look-up table using outputs from the convolutional coder.

24. The system of claim 20, wherein the branch metrics are computed using a Fast Walsh Transform.

25. The system of claim 20, wherein the decoding algorithm is a Viterbi algorithm, and wherein an optimum path is the path having a maximum accumulated branch metric.

26. The system of claim 21, wherein the transmitter further comprises;
- an embedding device that embeds a pilot signal into the BPSK data signal;
- a multiplexer that multiplexes the BPSK data signal to form a quadrature phase shift keyed (QPSK) signal; and
- a spreading device that spreads the QPSK signal.

27. The system of claim 20, wherein the receiver further comprises a despreading device performing BPSK despreading on a received QPSK signal to generate a BPSK signal, wherein the received QPSK signal comprises a BPSK data signal and an embedded pilot signal.

28. A computer readable medium containing executable instructions which, when executed in a processing system, causes the system to perform the steps for communicating signals comprising:
- demodulating a received signal; and
- despreading and decoding the received signal, wherein the de spreading and decoding comprises determining a plurality of cross correlation terms of the received signal with a plurality of transmitted biorthogonal Walsh sequences, the plurality of cross correlation terms used as branch metrics in a maximum likelihood decoding algorithm.

29. The computer readable medium of claim 28, wherein the processor is configured to compute the branch metrics using a Fast Walsh Transform.

30. The computer readable medium of claim 28, wherein the decoding algorithm is a Viterbi algorithm, and wherein an optimum path is the path having a maximum accumulated branch metric.

31. The computer readable medium of claim 28, further comprising the step of receiving a pilot signal, the pilot signal providing phase coherency.

32. The computer readable medium of claim 28, wherein the processor is further configured to process the received signal, the received signal comprising a trellis encoded and modulated input signal, wherein the trellis encoded and modulated input signal is spread to generate a BPSK data signal by mapping a plurality of branches of the trellis code to a plurality of biorthogonal Walsh sequences, the mapping comprising labeling the plurality of branches of the trellis code with the plurality of biorthogonal Walsh sequences.

33. The computer readable medium of claim 28, wherein the processor is further configured to perform the steps comprising:
- performing BPSK despreading on the received signal, wherein the received signal is a quadrature phase shift keyed (QPSK) signal;
- demultiplexing the despread signal to form a BPSK signal; and
- extracting a pilot signal and a BPSK data signal from the received signal.

* * * * *